United States Patent [19]
Grindahl

[11] Patent Number: 4,733,169
[45] Date of Patent: Mar. 22, 1988

[54] DIGITAL FREQUENCY DETECTOR

[75] Inventor: Mervin L. Grindahl, Waseca, Minn.

[73] Assignee: E. F. Johnson Company, Waseca, Minn.

[21] Appl. No.: 852,155

[22] Filed: Apr. 15, 1986

[51] Int. Cl.[4] .............................................. G01R 23/10
[52] U.S. Cl. .................................. 324/79 D; 307/516; 307/514
[58] Field of Search .......................... 324/78 D, 79 D; 364/485; 328/133, 134; 307/514, 516, 525, 526

[56] References Cited

U.S. PATENT DOCUMENTS 3,742,353  6/1973  Parisi ................................. 324/79 D

OTHER PUBLICATIONS

Pages 38–43 from Texas Instruments Incorporated Publication, D2629, dated Jan. 1981.

Primary Examiner—Stewart J. Levy
Assistant Examiner—Louis M. Arana
Attorney, Agent, or Firm—Dorsey & Whitney

[57] ABSTRACT

A frequency detector completely implemented with digital logic circuitry is disclosed. The frequency detector hereof employs a unique phase locked loop digitally implemented with asynchronous ripple counters, and a digitally implemented amplitude comparator and signal integrator. The detector is especially adapted for implementation in CMOS hardware, or similar hardware having low current drain characteristics. The selectivity of the detector can be set to a narrow bandwidth for excellent noise discrimination characteristics.

37 Claims, 5 Drawing Figures

DIGITAL FREQUENCY DETECTOR

RELATED APPLICATIONS

This application is related to the co-pending application entitled AUTOMATIC/REMOTE RF INSTRUMENT READING METHOD AND APPARATUS, filed on Feb. 20, 1985 and identified by Ser. No. 703,621 and to the co-pending application entitled IMPROVED AUTOMATIC/REMOTE RF INSTRUMENT MONITORING SYSTEM, filed in the U.S. Patent and Trademark Office on Mar. 14, 1986 and identified by Ser. No. 839,889. This is also related to my co-pending application entitled DATA DEMODULATOR, filed in the U.S. Patent and Trademark Office on Apr. 16, 1986 and identified by Ser. No. 852,539 and to the application entitled REMOTELY INTERROGATED TRANSPONDER, filed in the U.S. Patent and Trademark Office on June 1, 1987 and identified by Ser. No. 058,636.

TECHNICAL FIELD

A digital electronic circuit for detecting the presence or absence of a predetermined, discrete frequency is disclosed. The circuit is especially designed to be implemented in CMOS hardware, or equivalent hardware having extremely low current drain characteristics.

BACKGROUND ART

The advent of CMOS and other advanced semiconductor technologies has permitted the design of low power consumption digital circuits with current drains in the picoamp region. Heretofore, frequency detection circuits have required the use of band pass filters and other analog components typified by relatively high power consumption characteristics. A circuit that could determine the presence of a predetermined, discrete frequency through digitally implemented logic could take advantage of the new, semiconductor technology and provide a low power frequeny detector.

SUMMARY OF THE INVENTION

The frequency detector hereof incorporates a completely digital design that can be implemented through CMOS or similar semiconductor technology having low current drain characteristics. The detector indicates the presence or absence of an input signal of predetermined frequency through the combination of a unique, digitally implemented phase locked loop, and a digitally implemented amplitude detector and integrator. The input signal is presented to the detector, through an amplitude comparator or amplitude limiter, as a clipped and squared digital signal. A pulse inserter network in the phase locked loop sets the lock range of the phase locked loop to a predetermined bandwidth for discrimination of a preselected input frequency band. The amplitude detector and integrator provide a detection output signal only after the phase locked loop has locked onto an input signal of the desired frequency for a predetermined validation period.

DETAILED DESCRIPTION OF THE DRAWINGS

Figures 1, 2:
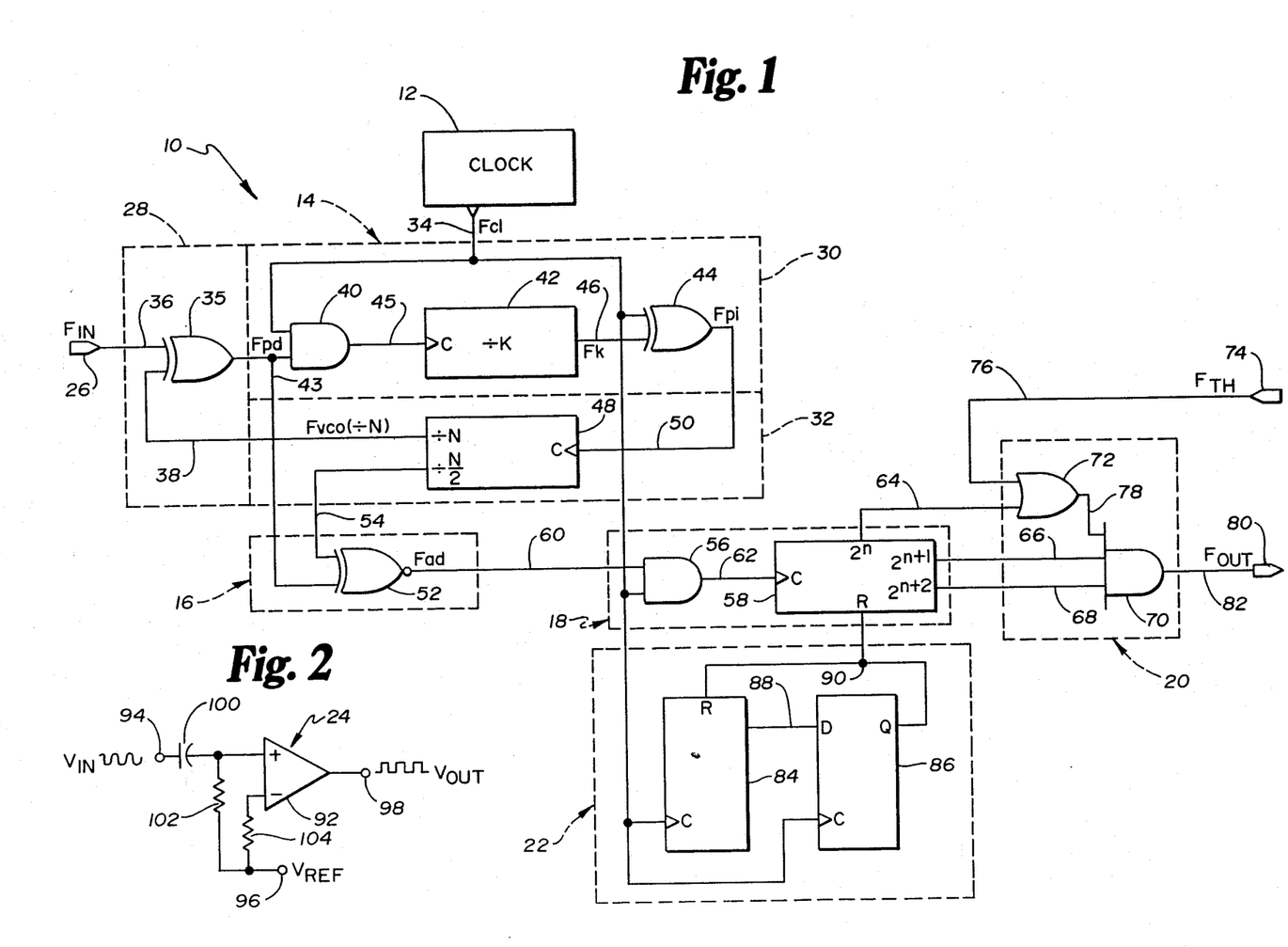
FIG. 1 is a schematic, logic diagram of the digital frequency detector in accordance with the present invention.
FIG. 2 is a schematic diagram of an amplitude comparator for converting an analog input signal into a digital input signal for presentation to the frequency detector.

Referring to the drawings, the digital frequency detector 10 in accordance with the present invention broadly includes clock 12, digital phase locked loop 14, amplitude detector 16, integrator 18, comparator 20, and timer circuit 22. An amplitude comparator circuit 24 provides a squared up, digital input signal to input terminal 26 of the frequency detector.

Phase locked loop 14 is a first order phase locked loop including a phase detector 28, pulse inserter 30, and feedback loop 32. The pulse inserter 30 and feedback loop 32 function as the digital counterpart to a voltage controlled oscillator in an analog phase locked loop. Phase locked loop 14 receives an input from clock 12 via lead 34.

Phase detector 28 of phase locked loop 14 comprises exclusive or gate 35 having one input lead 36 connected to signal input terminal 26, and a second input lead 38 connected to digital VCO 32.

Pulse inserter 30 includes and gate 40, asynchronous ripple counter 42, and exclusive or gate 44. The input terminals of and gate 40 are connected to clock 12, and the output of the exclusive or gate 35 of phase detector 28 via leads 34 and 43, respectively. The clocked input of asynchronous ripple counter 42 is connected to the output of and gate 40 via lead 45. The input terminals of exclusive or gate 44 are connected to the clock 12 and the output of asynchronous ripple counter 42 via leads 34 and 46 respectively.

Feedback loop 32 comprises asynchronous ripple counter 48 having its clocked input tied to the output of exclusive or gate 44 of pulse inserter 30 via lead 50. Counter 48 provides a $\div N$ and a $\div N/2$ output.

The amplitude detector 16 comprises exclusive nor gate 52. The input terminals of exclusive nor gate 52 are connected to the output of the phase locked loop phase detector 28 and the $\div N/2$ output of counter 48 via leads 43 and 54 respectively.

Integrator 18 comprises and gate 56 and asynchronous up counter 58. The input terminals of and gate 56 are connected to clock 12 and the output of amplitude detector 16 via leads 34 and 60 respectively. The clocked input of counter 58 is connected to the output of and gate 56 via lead 62.

Asynchronous up counter 58 is provided with a number of output terminals that change states at various, respective counts. For instance, the logic state presented on leads 64, 66, 68 change at counts that are multiples of $2^n$, $2^{n+1}$, and $2^{n+2}$, respectively.

Comparator 20 includes triple input and gate 70 and or gate 72. The input terminals of or gate 72 are connected to the $2^n$ terminal of counter 58 and threshold input terminal 74 by leads 64 and 76, respectively. The input terminals of and gate 70 are connected to the $2^{n+1}$ and $2^{n+2}$ output terminals of counter 58 via leads 66 and 68, respectively, and to the output of or gate 72 via lead 78. The output terminal of and gate 70 is connected to the output terminal 80 of digital frequency detector 10 via lead 82.

Timer 22 includes counter 84 and D flip flop 86. The clocked inputs of counter 84 and D flip flop 86 are tied together and connected to the master clock 12 via lead 34. The D input of D flip flop 86 is connected to the output terminal of counter 84 by lead 88. The Q output of D flip flop 86 is connected to the reset terminals of timer counter 84 and integrator counter 58 via lead 90.

Referring to FIG. 2, amplitude comparator 24 comprises differential amplifier 92, input terminal 94, reference terminal 96, output terminal 98, coupling capacitor 100, and biasing resistors 102, 104. The amplitude comparator 24 produces a squared up, digital signal (depicted as Vout in FIG. 2) for presentation to frequency detector input terminal 26, from a sinusoidal analog input signal (depicted as $V_{in}$ in FIG. 2).

The function of the phase locked loop 14 will now be described. In general, pulse inserter network 30 responds to the output of phase detector 28 to selectively insert additional pulses into the clock pulse train presentation to counter 48. The addition (or lack of addition) of pulses to the normal clock train input to counter 48 makes the output of feedback loop 32 appear that it can vary in frequency.

The detailed operation of phase locked loop 14 is best understood by first considering the instance whre the input signal ($F_{in}$) presented to the phase detector 28 and the $\div N$ output signal ($F_{VCO(\div N)}$) of counter 48 presented to the phase detector 28 are at the same frequency and exactly lined up in phase. The opposite case will then be considered, wherein the input signal ($F_{in}$) and the feedback signal of counter 48 are at the same frequency but exactly opposite inphase. Finally, the intermediate case, wherein the input signal and the feedback signal presented to the phase detector 28 are at the same frequency, but 90° out of phase, will be considered.

Given the assumption that the input signal $F_{in}$ presented at terminal 26, and the $\div N$ output of counter 48 presented to phase detector 28 are of the same frequency and exactly lined up in phase, the output of exclusive or gate 35 will always be low. This is so because both of the input signals to the exclusive or gate 35 will be low during the same half cycle, and will be high during the same half cycle. The output of exclusive or gate 35 is presented via lead 43 to and gate 40 of the pulse inserter circuitry 14. In the instant case, where the input signal and the feedback signal from counter 48 are of the same frequency and in phase, the output of phase detector 28 is always low and no pulses from the pulse train of clock 12 will be passed through and gate 40 to counter 42. The counter 42 will therefore remain in o ne of its two logic states and will not count. The output of exclusive or gate 44 will be a replica of the clock pulse train, either in phase, or 180° incremented in phase, relative to the clock pulse train, depending on the output logic state of counter 42.

The input signal ($F_{in}$) presented at terminal 26, and the $\div N$ output signal of counter 48 presented to the phase detector circuitry 28, were presumed to be at the same frequency and in phase. The numeric value of N for counter 48 is therefore dictated by the master clock frequency ($F_{cl}$), with reference to the frequency of the input signal ($F_{in}$), such that the clock frequency divided by N equals the frequency of the input signal ($F_{in}$). More simply put, counter 48 divides the input clock frequency ($F_{cl}$) by the number N, such that $F_{cl} \div N = F_{in}$.

The opposite case will now be considered, wherein the input signal ($F_{in}$) presented the phase detector 28, and t he output of the counter ($F_{VCO(\div N)}$) presented to phase detector 28 are of the same frequency, but exactly opposite in phase. In this case, the output of exclusive or gate 35 of phase detector 28 will always be high, because whenever the input signal ($F_{in}$) presented to exclusive or gate 35 of phase detector 28 is high, the digital VCO output ($F_{VCO(\div N)}$) will be low, and vice versa. The pulse train of the master clock 12 will in this case always be gated into counter 42 of pulse inserter 14, through and gate 40. The output of counter 42 will accordingly change states everytime a number (k) of master input clock pulses are counted by the counter 42. More simply put, counter 42 divides the pulse train presented at its clocked input by k. In the instant case, where the entire pulse train of the clock is gated to the clocked input of counter 42, the frequency of the output signal from the counter 42 ($F_k$) times k will equal the frequency of the clock signal, subh that $(k)(F_k)=F_{cl}$.

Figure 3:
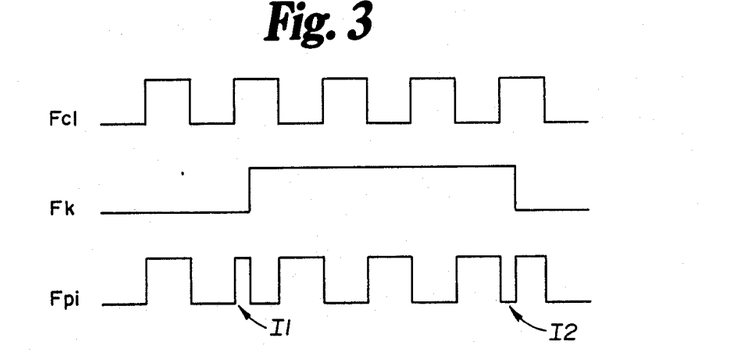
FIG. 3 is a timing diagram depicting the output of the pulse inserter portion of the detector phase locked loop.

The effect of counter 42 changing states on the output of pulse inserter 30 will now be described. The master clock input signal ($F_{cl}$) presented to exclusive or gate 44 via lead 34 is depicted in the timing diagram of FIG. 3, together with the input presented by counter 42 to exclusive or gate 44 ($F_k$), and the output of the exclusive or gate 44 ($F_{pi}$). Referring to FIG. 3, it will be understood that the output of pulse inserter 14 ($F_{pi}$), will increment in phase by 180 degrees, each time the output of counter 42 changes states. Moreover, an additional half pulse will be inserted into the output of the pulse inserter 14 when counter 42 changes states, since the master clock is applied directly to exclusive or gate 44, but experiences propagation delay through the asynchronous, ripple counter 42. The propagation delay of counter 42 must be at least as long as the pulse width necessary to clock counter 48, as depicted by pulsesd I1 and I2 of FIG. 3. In this regard, it will be understood that counter 42 could be a synchronous counter, so long as another means for inserting an appropriate propogation delay were provided, to delay the output of counter 42 ($F_k$) at least as long as the pulse width necessary to clock counter 48.

It will be appreciated that the number of pulses preseneted to counter 48 during a given time period will be the number of pulses in the master clock train, plus each half pulse added to the master clock train when the counter 42 changes states. In other words, the frequency of the pulse train of the signal $F_{pi}$ presented to the counter 48 is the sum of the frequency of the clock signal $F_{cl}$ and the freqency of the output signal $F_k$ of counter 42. Because the output signal ($F_k$) of counter 42 is the frequency of the clocked input signal divided by the constant k, and because the clocked input to counter 42 can be no greater than the master clock frequency (occurring in the above described situation where the input signal to phase detector 28 and the signal presented to phase detector 28 by counter 48 are at the same frequency and 180° out of phase), the maximum frequency of the signal $F_{pi}$ that can be presented by the pulse inserter 30 to the counter 48 is the master clock frequency ($F_{cl}$) plus the frequency of the master clock divided by k, or $F_{pi(max)}=F_{cl}+(F_{cl} \div k)$.

As explained above, the maximum frequency of the signal $F_{pi}$ presented by pulse inserter 30 to counter 48 of feedback loop 32 is $F_{cl}+(F_{cl} \div k)$. The minimum frequency of the signal $F_{pi}$ presented by the pulse inserter 30 to counter 48 is the frequency of the clock ($F_{cl}$) (occurring, as described above, when the input signal $F_{in}$ presented at terminal 26 of phase detector 28 and the output signal $F_{VCO(\div N)}$ of counter 48 presented to phase detector 28 are of the same frequency and in phase). Considering that counter 48 divides the frequency of the signal ($F_{pi}$) presented to it by the pulse inserter 30 by the number N, it will be understood that the maximum input signal frequency ($F_{in}$) that the phase locked loop 14 can acquire is $(F_{cl}+(F_{cl}\div k))\div N$, or $F_{cl}/N(1+1/k)$. The minimum input signal frequency that the phase locked loop 14 can acquire is $F_{cl}\div N$). Subtracting the minimum lock frequency from the maximum lock frequency yields a lock range of $F/N(1+1/k)-F_{cl}/N$ or $F_{cl}/Nk$. *The center frequency of the lock range is the minimum lock frequency plus one-half of the lock range, or $F_{cl}/N+\frac{1}{2}F_{cl}/Nk=F_{cl}/N(1+1/2k)$.* Examination of the above formulae reveals that the lock range of the phase locked loop 14 can be narrowed (thereby increasing the frequency selectivity of the digital frequency detector), by decreasing $F_{cl}$, or increasing the product of constants k and N.

Figure 4:
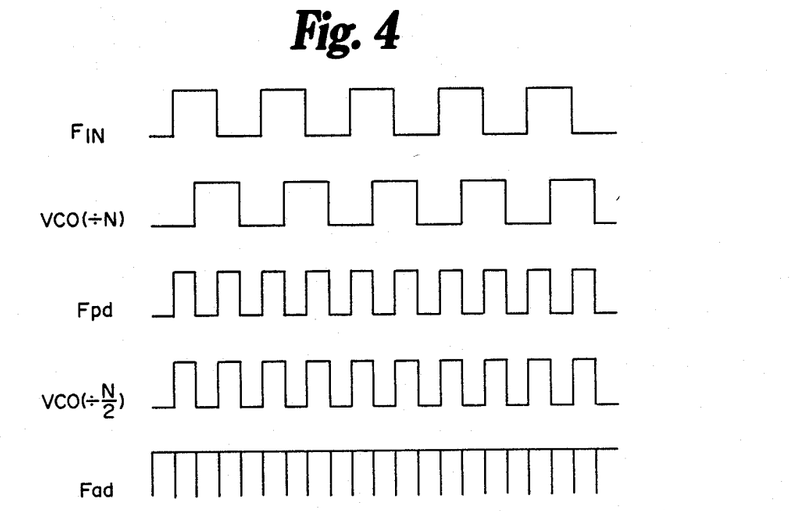
FIG. 4 is a timing diagram depicting the output of the detector amplitude comparator, when the detector phase locked loop is locked on an input signal having a frequency equal to the phase locked loop center frequency.

Turning to FIG. 4, the final case, wherein the input signal ($F_{in}$) presented at terminal 26 of phase detector 28 of the phase locked loop 14, and the output of the counter 48 ($F_{VCO(\div N)}$) presented to the phase detector 28 are of the same frequency but 90 degrees out of phase will be considered. The output signal ($F_{pd}$) of exclusive or gate 35 of phase detector 28 will in that instance have a 50 percent duty cycle, as shown in FIG. 4, and will be a square wave signal having a frequency of twice the input signal ($F_{in}$). And gate 40 of pulse inserter 14 will therefore gate the master clock input pulse train to counter 42 fifty percent of the time, and the frequency of the pulse train presented by the pulse inserter 14 to the counter 48 will be $F_{cl}+\frac{1}{2}F_{cl}/k$ or $F_{cl}(1+1/2k)$. Recalling that counter 42 divides the pulse inserter output signal frequency by N, the output signal frequency of the counter 48, as presented to the phase detector 28 will be $F_{cl}/N(1+1/2k)$, which is the previously calculated center frequency of the phase locked loop lock range.

The operation of the amplitude detector 16, integrator 18, comparator 20, and timer 22 can now be understood, with reference to the above described operation of the phase locked loop 14. The output of phase locked loop 14 is connected to the amplitude detector 16 of digital frequency detector 10 by leads 54 and 43. In particular, lead 43 connects one input terminal of exclusive nor gate 52 to the output of counter 48. The operation 28, and lead 54 connects the other input terminal of exclusive nor gate 52 to the $\div N/2$ output of counter 48. The operation of the amplitude detector 16 is best understood by considering the instance where the phase locked loop 14 has locked onto an input signal ($F_{in}$) having a frequency equal to the center frequency of the phase locked loop. The output signal of the amplitude detector 16 presented on lead 60 in such instance is depicted by $F_{ad}$ in the timing diagram of FIG. 4.

In particular, and referring to FIG. 4, the output of the $\div N/2$ terminal of counter 48 is a square wave pulse train having a frequency exactly double the frequency of the $\div N$ output of counter 48, with the trailing edge of each pulse of the $\div N$ output terminal pulse train synchronized with a trailing edge of an output pulse of the $\div \frac{1}{2}N$ output terminal of the counter 48. As is best determined from the timing diagram of FIG. 4, the output signal $F_{pd}$ of phase detector 28, when the $\div N$ output of counter 48 is of the same frequency and incremented 90° in phase from the input signal ($F_{in}$) (which as described above, occurs when the frequency of the input signal ($F_{in}$) equals the center lock frequency of the phase locked loop 14), will be of the same frequency and in phase with the $\div N/2$ output of counter 48. Accordingly, the output of exclusive nor gate 52 of amplitude detector 16 ($F_{ad}$), will be a continuous logic high level. As the frequency of the input signal $F_{in}$, and thus the phase relationship between $F_{in}$ and the $\div N$ output of counter 48, change from the values established by the center lock frequency of the phase lock loop 14, the output of the amplitude detector $F_{ad}$ presented on lead 60 will no longer be continuous; that is to say, the duty cycle will become less than 100 percent. The duty cycle of the output signal of amplitude detector 16 will decrease to fifty percent if the incoming signal $F_{in}$ is totally out of the lock range of the phase locked loop 14.

Integrator 18, threshold detector 20, and timer 22, act together to provide a detect output signal on digital frequency detector output terminal 80 only when an input signal ($F_{in}$) of preselected frequency is presented to the input terminal 26 of frequency detector 10 for an amount of time preselected by the setting of integrator 18 and comparator 20. In particular, the pulse train of the master clock signal ($F_{cl}$) is gated through and gate 56 to counter 58 of integrator 18 only when the output of amplitude detector 16 is a logic high, and the duty cycle over which the output of amplitude detector 16 is a logic high is a function of whether phase locked loop 14 has acquired an input signal ($F_{in}$) of preselected frequency. Timer 22 resets the counter 58 of integrator 18 at a periodic, predetermined interval. Counter 58 will provide a detect output signal, through comparator 20, only if a predetermined number of clock train pulses are gated to the counter 58 through and gate 56 during the time interval established by timer 22.

As described above, the duty cycle of amplitude comparator 16 varies from 50%, when the frequency of input signal ($F_{in}$) is outside of the lock range of phase locked loop 14, to 100%, when the frequency of input signal $F_{in}$ is at the center frequency of the lock range of phase locked loop 14. During a given reset interval for counter 58 (as established by timer 22), the output of amplitude detector will therefore be high at least 50% of the interval, and at least 50% of the clock signal pulse train will be presented to the counter 58. Comparator 20 must therefore be set to provide a detect output only when at least more than 50% of the pulse train of clock signal ($F_{cl}$) presented during a given time interval has been counted by counter 58. This is conveniently accomplished by resetting counter 58 at a 1 hertz interval, and setting the comparator 20 to provide a detect output only when a number of pulses equal to more than one-half the frequency of $F_{cl}$ has been counted.

It will be appreciated that the duty cycle of amplitude comparator 16 will increase from 50% towards 100% as the frequency of the input signal ($F_{in}$) approaches the center frequency of the lock range of phase locked loop 14 (previously calculated as $F_{cl}/N(1+1/2k)$). The frequency selectivity of the detector 10 can accordingly be adjusted by increasing the number of clock pulses that must be counted by counter 58 during a given time interval before comparator 20 provides a detect output signal. Stated another way, the frequency of the input signal ($F_{in}$) must be close enough to the center lock frequency of phase locked loop 14, such that the duty cycle of amplitude detector 16 is large enough to gate the required number of pulses from the clock signal ($F_{cl}$) through and gate 56 to counter 58, such that the count of counter 58 reaches a high enough number for comparator 20 to provide a detect output before the counter 58 is reset by timer 22. It will be appreciated that, with the timer 22 conveniently set to provide a reset pulse at a frequency of 1 hertz, comparator 20 can be set to provide a detect output at a count no higher than a count corresponding to the frequency of the clock signal ($F_{cl}$).

Figure 5:
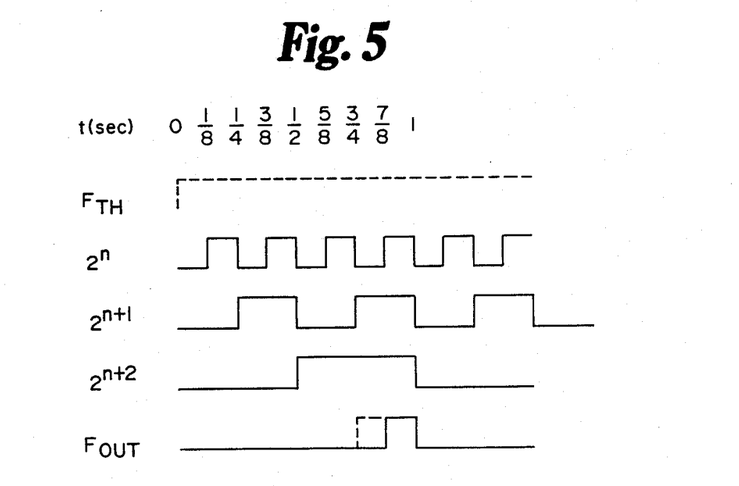
FIG. 5 is a timing diagram depicting the detect output of the detector comparator.

Referring to the timing diagram of FIG. 5, the operation of comparator 20 to selectively respond to different count outputs of counter 58 of integrator 18 will be described. Counter 58 includes output terminals that change states each time a count that is a multiple of $2^n$, $2^{n+1}$, and $2^{n+2}$, respectively are reached by the counter. The timing diagram of FIG. 5 assumes that counter 58 is continuously clocked at a regular frequency, thereby providing symmetrical square wave outputs from each of the counter output terminals. It will be understood that, if there were a hiatus in the clock input to counter 58, each of the wave forms depicted in FIG. 5 would be elongated at the point of hiatus until the input clock pulse train was reapplied to counter 58, and the appropriate count were reached for the output terminals to change logic states. Also, for simplicity of explanation, the timing diagram of FIG. 5 assumes that the frequency of the clocked pulse signal ($F_{cl}$) applied to the clocked input of counter 58 is $2^{n+2}$, and that counter 58 counts both leading and trailing edges of each pulse. The logic state of the $2^n$ output of counter 58 will therefore change states every eight second, the output of the $2^{n+1}$ output will change states every $\frac{1}{4}$ second, and the output of the $2^{n+2}$ output will change states every half second. As depicted in the timing diagram of FIG. 5, the logic levels of all three counter outputs are high simultaneously only at the seventh/eighths second mark.

A threshold signal ($F_{th}$) can be applied to the comparator 20 through or gate 72, essentially cancelling the effect of the $2^n$ output of counter 58 presented to comparator 20 via lead 64. Referring to the timing diagram of FIG. 5, it will be seen that setting the logic level of the threshold signal ($F_{th}$) at a logic high, will produce a continuous logic high signal to and gate 70 from or gate 72, producing a detect out signal from gate 70, an eighth of a second earlier than when the threshold signal logic level is at a logic low.

Timer 22 provides a reset pulse to counter 58 of integrator 18 at a predetermined interval. Counter 84 of timer 22 is clocked by the input clock signal ($F_{cl}$) to provide an output via lead 88 to D flip flop 86 after counter 84 reaches a predetermined count. When the D input of D flip flop 86 is brought to a high logic level by counter 84, a reset pulse will be provided on the Q output of D flip flop 86 when the next pulse from clock signal ($F_{cl}$) is presented to the clocked input of D flip flop 86. The Q output of D flip flop 86 will go to a high logic level for on clock pulse width, also resetting counter 58 and counter 84.

I claim:

1. A digital phase locked loop for receiving an input pulse train having an input frequency and for generating an output pulse train having a frequency and duty cycle which approach predetermined values relative to the input pulse train when the input frequency is within a predetermined frequency lock range comprising:

clock means for generating a clock pulse train having a constant frequency;

feedback means operably coupled to the clock means for generating a feedback pulse train having a frequency within the predetermined frequency lock range, the predetermined frequency lock range having a lower limit equal to a first fraction of the clock frequency and an upper limit equal to a second fraction of the clock frequency:

comparison means operably coupled to the feedback means for receiving the input pulse train and comparing the input pulse train and the feedback pulse train and generating the output pulse train, the output pulse train having a duty cycle corresponding to the coincidence between the input pulse train and the feedback pulse train; and pulse inserter means operably coupled to the feedback means and the clock means and the comparison means for generating a modified clock pulse train in response to the duty cycle of the output pulse train, whereby the modified clock pulse train is received by the feedback means and the frequency of the feedback pulse train is continuously modified to approach the input frequency when the input frequency is within the predetermined frequency lock range.

2. The digital phase locked loop of claim 1 wherein the pulse inserter means comprises:

means operably connected to the clock means for changing the phase of the clock pulse train;

means operably coupled to the comparison means and the clock means for triggering the change in phase of the clock pulse train in response to the duty cycle of the output pulse train; and means operably coupled to the means for changing the phase of the clock pulse train and the means for triggering the change in phase of the clock pulse train for delaying the change in phase of the clock pulse train, such that the change in phase of the clock pulse train is delayed long enough to generate an additional pulse in the modified clock pulse train.

3. The digital phase locked loop of claim 2 wherein the means for triggering the change in phase of the clock pulse train and the means for delaying the change in phase of the clock pulse train comprises:

a gating circuit operably connected to the clock means and the comparison means for providing a gating signal when both the clock pulse train and the output pulse train are at a digital high state; and an asynchronous ripple counter operably connected to the gating circuit, such that the asynchronous ripple counter is clocked by the clock pulse train when the gating signal is present.

4. The digital phase locked loop of claim 2 wherein the means for changing the phase of the clock pulse train comprises an exclusive-OR circuit operably connected to the means for delaying the change in the phase of the clock pulse train and the clock means.

5. The digital phase locked loop of claim 1 wherein the feedback means generates the feedback pulse train comprising a square wave having a frequency within the predetermined frequency lock range.

6. The digital phase locked loop of claim 5 wherein the feedback means comprises an asynchronous ripple counter.

7. The digital phase locked loop of claim 1 wherein the comparison means comprises a phase detector.

8. The digital phase locked loop of claim 7 wherein the phase detector is an exclusive-OR circuit.

9. The digital phase locked loop of claim 1 wherein the predetermined values of the frequency and duty cycle that the output pulse train will approach comprise a square wave having a frequency twice the input frequency with a fifty percent duty cycle when the input frequency approaches a center lock frequency half way between the upper limit and the lower limit of the predetermined frequency lock range.

10. A digital phase locked loop, comprising:
   input means for receiving an input signal pulse train;
   clock means for generating a master clock pulse train having a master clock pulse train frequency;
   pulse inserter means operably coupled to the clock means for selectively inserting additional pulses into the master clock pulse train to generate a modified clock pulse train having a modified clock pulse train frequency;
   feedback means operably coupled to the pulse inserter means for generating a feedback signal pulse train responsive to the modified clock pulse train frequency; and
   comparator means operably coupled to the input means and the feedback means for providing a pulse inserter actuating signal in response to the comparative values of the input signal pulse train and the feedback signal pulse train, whereby the pulse inserter is selectively actuated by the pulse inserter actuating signal to insert pulses into the master clock pulse train in response to the comparative values of the input signal and the feedback signal, and the feedback signal is thereby continuously modified to approach a predetermined value relative to the input signal.

11. The digital phase locked loop of claim 10 wherein the pulse inserter means comprises:
   means operably coupled to the clock means for changing the phase of the master clock pulse train;
   means operably coupled to the comparator means and the clock means for triggering the change in phase of the master clock pulse train in response to the pulse inserter actuating signal; and
   means operably coupled to the means for changing the phase of the master clock pulse train and the means for triggering the change in phase of the master clock pulse train for delaying the change in phase of the master clock pulse train long enough to generate an additional pulse in the modified clock pulse train.

12. The digital phase locked loop of claim 11 wherein the means for triggering the change in phase of the master clock pulse train and the means for delaying the change in phase of the master clock pulse train comprises:
   a gating circuit operably connected to the clock means and the comparator means for providing a gating signal when both the master clock pulse train and the pulse inserter actuating signal are at a digital high state; and
   an asynchronous ripple counter operably connected to the gating circuit, such that the asynchronous ripple counter is clocked by the master clock pulse train when the gating signal is present.

13. The digital phase locked loop of claim 11 wherein the means for changing the phase of the master clock pulse train comprises an exclusive-OR circuit operably connected to the means for delaying the change in the phase of the master clock pulse train and the clock means.

14. The digital phase locked loop of claim 10 wherein the feedback means comprises an asynchronous ripple counter.

15. The digital phase locked loop of claim 10 wherein the comparator means comprises a phase detector.

16. The digital phase locked loop of claim 15 wherein the phase detector is an exclusive-OR circuit.

17. The digital phase locked loop of claim 10 wherein the predetermined value relative to the input signal is a square wave having a frequency equal to, but ninety degrees out of phase with, the input pulse train.

18. A digital phase locked loop, comprising:
   input means for receiving an input signal pulse train;
   clock means for generating a master clock pulse train having a master clock pulse train frequency;
   frequency altering means operably coupled to the clock means for selectively modifying the master clock pulse train, thereby generating a modified clock pulse train having a modified clock pulse train frequency;
   feedback means operably coupled to the frequency altering means for generating a feedback signal pulse train correlating to the modified clock pulse train frequency; and
   comparator means operably coupled to the input means and the feedback means for providing a frequency altering means actuating signal in response to the comparative values of the input signal pulse train and the feedback signal pulse train, whereby the frequency altering means are selectively actuated by the actuating signal to alter the master clock pulse train in response to the comparative values of the input signal and the feedback signal, and the feedback signal is thereby continuously modified to approach a predetermined value relative to the input signal.

19. The digital phase locked loop of claim 18 wherein the frequency altering means comprises:
   means operably coupled to the clock means for changing the phase of the master clock pulse train;
   means operably coupled to the means for changing the phase of the master clock pulse train for delaying long enough to generate an additional pulse in the modified clock pulse train.

20. The digital phase locked loop of claim 19 wherein the means for delaying the change in phase of the master clock pulse train comprises an asynchronous ripple counter.

21. The digital phase locked loop of claim 18 wherein the feedback means comprises an asynchrounous ripple counter.

22. The digital phase locked loop of claim 18 wherein the comparator means comprises a phase detector.

23. The digital phase locked loop of claim 18 wherein the phase detector is an exclusive OR circuit.

24. The digital phase locked loop of claim 18 wherein the predetermined value relative to the input signal is a square wave having a frequency equal to, but ninety degrees out of phase with, the input pulse train.

25. A method of implementing a digital phase locked loop having a specified frequency lock range comprising:
   generating a master clock signal having a constant clock frequency;

generating a feedback pulse train having a frequency within the specified frequency lock range;

receiving an input pulse train;

comparing the input pulse train and the feedback pulse train and generating a pulse inserter signal in response to the comparative values of the input pulse train and the feedback pulse train;

modifying the feedback pulse train by inserting or not inserting additional pulses into the feedback pulse train in response to the pulse inserter signal, so that the feedback pulse train approaches a predetermined value relative to the input pulse train.

26. The method of implementing a digital phase locked loop of claim 25 wherein the step of generating a feedback pulse train comprises:

establishing a lower lock range limit for the specified frequency lock range equal to a first fraction of the clock frequency;

establishing an upper lock range limit for the specified frequency lock range equal to a second fraction of the clock frequency which is greater than the first fraction;

defining a center frequency for the specified frequency lock range equal to one-half the specified frequency lock range greater than the lower lock range limit; and generating a feedback pulse train having a normal free-running frequency equal to the lower lock range limit instead of the center frequency.

27. The method of implementing a digital phase locked loop of claim 26 wherein the step of modifying the feedback pulse train comprises:

continuously adding or not adding pulses to the lower lock range limit such that the feedback pulse train will approach a predetermined value relative to the input pulse train.

28. The method of implementing a digital phase locked loop of claim 25 wherein the predetermined value relative to the input pulse train is a square wave having a frequency equal to, but ninety degrees out of phase with, the input pulse train.

29. A digital frequency detector for receiving an input pulse train having an input frequency and generating an output signal if the input frequency is within a predetermined frequency lock range for a predefined portion of a preselected time period comprising:

clock means for generating a clock pulse train having a constant frequency;

a digital phase locked loop operably connected to the clock means for receiving the input pulse train and generating an output pulse train having a frequency and duty cycle which approach predetermined values relative to the input pulse train when the input frequency is within the predetermined frequency lock range;

integrator means operably connected to the digital phase locked loop and the clock means for determining an amount of time during the preselected time period that the input frequency is within the predetermined frequency lock range; and comparator means operably connected to the integrator means for generating an output signal when the amount of time determined by the integrator means exceeds the predefined portion.

30. The digital frequency detector of claim 29 wherein the digital phase locked loop further comprises feedback means operably connected to the clock means for generating a feedback pulse train having a frequency within the predetermined frequency lock range, the lock range having a lower limit equal to a first fraction of the clock frequency and an upper limit equal to a second fraction of the clock frequency.

31. The digital frequency detector of claim 30 wherein the digital frequency detector further comprises means for generating a comparison pulse train which approaches the predetermined values of the frequency and duty cycle of the output pulse train.

32. The digital phase locked loop of claim 31 wherein the predetermined values of the frequency and duty cycle which the output pulse train will approach comprise a square wave having a frequency twice the input frequency with a fifty percent duty cycle when the input frequency approaches a center lock frequency half way between the upper limit and the lower limit of the predetermined frequency lock range.

33. The digital frequency detector of claim 30 wherein the integrator means comprises:

detector means for comparing the comparison pulse train and the output pulse train and generating a detected pulse train having a duty cycle; and counter means operably connected to the clock means and the detector means for determing the amount of time that the input frequency is within the predetermined frequency lock range by counting an amount of time that the input pulse train and the feedback pulse train coincide based upon the duty cycle of the detected pulse train; and reset means operably connected to the clock means and the counter means for resetting the counter means after the preselected time period.

34. A method for detecting whether the frequency of an input pulse train is within a specified frequency range for a specified time period, comprising:

generating a master clock signal having a constant clock frequency;

generating a feedback pulse train having a frequency within the specified frequency rang;

generating an output pulse train by comparing the input pulse train with the feedback pulse train;

modifying the feedback pulse train when the input pulse train and the feedback pulse train do not coincide;

comparing the duty cycle of the output pulse train to an established threshold value greater than fifty percent; and generating an output signal when the duty cycle of the output pulse train exceeds the threshold value for the specified time period.

35. The method for detecting whethet the frequency of an input pulse train is within a specified frequency range of claim 34 wherein the step of modifying the feedback pulse train by inserting or not inserting pulses in the feedback pulse train when the input pulse train and the feedback pulse train do not coincide.

36. The method for detecting whether the frequency of an input pulse train is within a specified frequency range of claim 34 wherein the step of generating a feedback pulse train comprises:

establishing a lower lock range limit for the specified frequency range equal to a first of the clock frequency;

establishing an upper lock range limit for the specified frequency range equal to a second fraction of the clock frequency which is greater than the first fraction;

defining a center frequency for the specified frequency range equal to one-half the specified frequency range greater than the lower lock range limit; and generating a feedback pulse train having a normal free-running frequency equal to the lower lock range limit instead of the center frequency.

37. The method for detecting whether the frequency of an input pulse train is within a specified frequency range of claim 36 wherein the step of modifying the feedback pulse train comprises:

continuously adding or not adding pulses to the lower lock range limit such that the feedback pulse train will approach a predetermined value relative to the input pulse train.

* * * * *

UNITED STATES PATENT AND TRADEMARK OFFICE
CERTIFICATE OF CORRECTION

PATENT NO. : 4,733,169

DATED : March 22, 1988

INVENTOR(S) : Mervin L. Grindahl

It is certified that error appears in the above-identified patent and that said Letters Patent is hereby corrected as shown below:

Column 4, line 42, delete the word "propogation" and substitute therefor --propagation--.

Column 3, line 29, delete the word "whre" and substitute therefor --where--.

Column 3, line 54, delete the word "o ne" and substitute therefor --one--.

Column 4, line 4, delete the words "presented the" and substitute therefor --presented to--.

Column 4, line 5, delete the word "t he" and substitute therefor --the--.

Column 4, line 22, delete the word "subh" and substitute therefor --such--.

Column 5, lines 16-19, the words "The center frequency of the lock range is the minimum lock frequency plus one-half of the lock range, or" should not be italicized.

UNITED STATES PATENT AND TRADEMARK OFFICE
CERTIFICATE OF CORRECTION

PATENT NO. : 4,733,169

DATED : March 22, 1988

INVENTOR(S) : Mervin L. Grindahl

It is certified that error appears in the above-identified patent and that said Letters Patent is hereby corrected as shown below:

Column 5, line 52, delete the words "counter 48. The operation" and substitute therefor --phase detector--.

Column 6, line 14, delete the words "lock loop" and substitute therefor --locked loop--.

Column 7, line 34, delete the word "eight" and substitute therefor --eighth--.

Column 10, line 47, delete the word "long" and substitute therefor --the change in phase of the master clock pulse train long--.

Column 10, line 59, delete the words "exclusive OR" and substitute therefor --exclusive-OR--.

Column 12, line 40, delete the word "rang" and substitute therefor --range--.

Signed and Sealed this

Twenty-second Day of November, 1988

Attest:

DONALD J. QUIGG

*Attesting Officer*      *Commissioner of Patents and Trademarks*